US006420084B1

(12) United States Patent
Angelopoulos et al.

(10) Patent No.: US 6,420,084 B1
(45) Date of Patent: Jul. 16, 2002

(54) MASK-MAKING USING RESIST HAVING SIO BOND-CONTAINING POLYMER

(75) Inventors: Marie Angelopoulos, Cortlandt Manor; Ari Aviram, Croton-on-Hudson; C. Richard Guarnieri, Somers; Wu-Song Huang, Poughkeepsie; Ranee Kwong, Wappingers Falls; Robert N. Lang, Pleasant Valley; Arpan P. Mahorowala, White Plains; David R. Medeiros, Ossining; Wayne M. Moreau, Wappingers Falls, all of NY (US)

(73) Assignee: International Business Machines Corporation, Armonk, NY (US)

( * ) Notice: Subject to any disclaimer, the term of this patent is extended or adjusted under 35 U.S.C. 154(b) by 40 days.

(21) Appl. No.: 09/602,136

(22) Filed: Jun. 23, 2000

(51) Int. Cl.[7] .............................................. G03F 7/004
(52) U.S. Cl. .................... 430/270.1; 430/313; 430/326; 430/277.1; 430/278.1
(58) Field of Search .............................. 430/270.1, 326, 430/313, 277.1, 278.1

(56) References Cited

U.S. PATENT DOCUMENTS

| 4,822,716 A | | 4/1989 | Onishi et al. |
| 5,306,584 A | | 4/1994 | Palmer |
| 5,338,818 A | | 8/1994 | Brunsvold et al. |
| 5,378,585 A | | 1/1995 | Watanabe |
| 5,422,223 A | | 6/1995 | Sachdev et al. |
| 5,484,867 A | | 1/1996 | Lichtenhan et al. |
| 5,612,170 A | | 3/1997 | Takemura et al. |
| 5,731,126 A | * | 3/1998 | Takemura et al. ....... 430/270.1 |
| 5,756,254 A | | 5/1998 | Kihara et al. |
| 5,872,041 A | * | 2/1999 | Lee et al. .................... 438/397 |
| 5,882,844 A | * | 3/1999 | Tsuchiya et al. ......... 430/288.1 |
| 5,948,570 A | | 9/1999 | Kornblit et al. |
| 5,952,155 A | | 9/1999 | Sakakibara et al. |
| 5,972,560 A | | 10/1999 | Kaneko et al. |
| 6,017,658 A | | 1/2000 | Rhee et al. |
| 6,037,097 A | | 3/2000 | Bucchignano et al. |
| 6,040,096 A | | 3/2000 | Kakizaki et al. |
| 6,042,989 A | * | 3/2000 | Schaedeli et al. ........ 430/270.1 |
| 6,043,003 A | | 3/2000 | Bucchignano et al. |
| 6,200,846 B1 | * | 3/2001 | Watanabe .................... 438/239 |
| 6,303,268 B1 | * | 10/2001 | Namba et al. ........... 430/270.1 |

FOREIGN PATENT DOCUMENTS

EP    0758102 A1    2/1997

OTHER PUBLICATIONS

Hybrid Organic–Inorganic Thermoplastics: Styryl–Based Polyhedral Oligomeric Silsesquioxane Polymers by Timothy S. Haddad, et al. Macromolecules 1996, 29, 7302–7304. 1 page.

* cited by examiner

Primary Examiner—Rosemary Ashton
(74) Attorney, Agent, or Firm—Steven Capella

(57) ABSTRACT

The invention provides improved resist compositions and lithographic methods using the resist compositions of the invention. The resist compositions of the invention are acid-catalyzed resists which are characterized by the presence of an SiO-containing polymer. The invention also encompasses methods of forming patterned material layers (especially conductive, semiconductive, or magnetic material structures) using the combination of the SiO-containing resist and a halogen compound-containing pattern transfer etchant where the halogen is Cl, Br or I.

28 Claims, No Drawings

MASK-MAKING USING RESIST HAVING SIO BOND-CONTAINING POLYMER

BACKGROUND OF THE INVENTION

In the microelectronics industry as well as in other industries involving construction of microscopic structures (e.g. micromachines, magnetoresistive heads, etc.), lithography is used to obtain patterned structures of various materials such as insulators, semiconductors and/or metals in a sequence leading to the achievement of the desired structure.

Most lithographic processes (excluding so-called direct-write techniques) typically employ some type of patterned mask through which the imaging radiation is projected onto the resist material to be patterned on the substrate of interest. Typically, the mask itself is formed by a lithographic technique such as direct-write electron beam lithography or in some instances by projection UV lithography (especially deep UV—248 nm) using an appropriate resist material. Typically, the mask comprises a patterned metal layer(s) (e.g., chromium) on a quartz plate (or other transparent plate).

A resist composition must possess desirable radiation response characteristics to enable image resolution upon exposure to a desired radiation development. Thus, a pattern wise exposed positive resist must be capable of appropriate response (i.e. selective dissolution of exposed areas) to a developer to yield the desired resist structure. Given the extensive experience in the lithographic arts with the use of aqueous alkaline developers, it is important to achieve appropriate dissolution behavior in such commonly used developer solutions.

The resist composition must also possess suitable chemical and mechanical properties to enable transfer to the image from the patterned resist to an underlying substrate layer(s). Typically, pattern transfer is performed by some form of wet chemical etching or ion etching. The ability of the patterned resist layer to withstand the pattern transfer etch process (i.e., the etch resistance of the resist layer) is an important characteristic of the resist composition. In the case of typical mask making processes, a chlorine-containing etchant such as combination of $Cl_2$ and $O_2$ is generally a preferred etchant. Halogen-based etchants other than fluorine (i.e., Cl, Br, or I) are also a preferred etchant for patterning metals and semiconductor (e.g., polycrystalline silicon) materials.

With demands for finer detailed masks and patterned metals/semiconductor materials, the performance of higher atomic weight halogen-based (i.e., Cl, Br, or I) etching processes has been increasingly problematic due to excessive erosion of the resist during the etching step needed for pattern transfer. Thus, there is a need for improved processes for making patterned metal and/or semiconductor features and especially for making lithographic masks containing patterned metal layers.

SUMMARY OF THE INVENTION

The invention provides improved resist compositions and lithographic methods using the resist compositions of the invention. The resist compositions of the invention are acid-catalyzed resists which are characterized by the presence of an SiO-containing polymer. The invention also encompasses methods of forming patterned material layers (especially conductive, semiconductive, or magnetic material structures) using the combination of the SiO-containing resist and a halogen compound-containing pattern transfer etchant where the halogen is Cl, Br or I.

In one aspect, the invention encompasses a positive resist composition, the composition comprising:
(a) a polymeric component, at least a portion of the polymeric component containing SiO moieties, at least a portion of the polymeric component containing pendant acid labile moieties which inhibit solubility of the resist in aqueous alkaline solutions, and at least a portion of the polymeric component containing pendant polar moieties which promote alkaline solubility of the resist in aqueous alkaline solutions, and
(b) a radiation-sensitive acid generator.

The polymeric component preferably includes a silsesquioxane polymer. The acid labile solubility-inhibiting functionality may be present on the same polymer which contains the SiO moieties or may be present on a separate polymer forming part of the total polymeric component.

In another aspect, the invention encompasses a method of creating a patterned material structure on a substrate, the method comprising:
(a) providing a substrate having material layer thereon to be patterned,
(b) providing a layer of positive resist over the material layer, the radiation-sensitive resist comprising a polymeric component, at least a portion of the polymeric component containing SiO moieties, at least a portion of the polymeric component containing pendant acid labile moieties which inhibit solubility of the resist in aqueous alkaline solutions, and at least a portion of the polymeric component containing pendant polar moieties which promote alkaline solubility of the resist in aqueous alkaline solutions,
(c) pattern wise exposing portions of the resist to imaging radiation,
(d) removing the exposed portions of the resist to form spaces defined by remaining unexposed portions of the resist layer,
(e) removing portions of the material layer at the spaces by contacting the material layer with an etchant compound comprising a halogen atom selected from the group consisting of Cl, Br, and I, and
(f) removing any remaining portions of the resist layer.

The material layer provided in step (a) is preferably selected from the group consisting of metals and semiconductors, more preferably a chromium-containing metal.

These and other aspects of the invention are discussed in further detail below.

DETAILED DESCRIPTION OF THE INVENTION

The invention provides improved resist compositions and lithographic methods using the resist compositions of the invention. The resist compositions of the invention are acid-catalyzed resists which are characterized by the presence of an SiO-containing polymer. The invention also encompasses methods of forming patterned material layers (especially conductive, semiconductive, or magnetic material structures) using the combination of the SiO-containing resist and a halogen compound-containing pattern transfer etchant where the halogen is Cl, Br or I.

The resist compositions of the invention are characterized in part by the presence of a polymeric component where:
(i) at least a portion of the polymeric component contains SiO moieties,
(ii) at least a portion of the polymeric component contains pendant acid labile moieties which inhibit solubility of the resist in aqueous alkaline solutions, and (iii) at least a portion of the polymeric component containing pendant polar moieties which promote alkaline solubility of the resist in aqueous alkaline solutions.

The portion of the polymeric component containing SiO moieties may have the SiO moieties present as part a polymer backbone or in groups which are pendant from the polymer backbone. Preferably, the SiO moieties form part of a polymer backbone structure. More preferably, the SiO moieties are present as part of an organosiloxane polymer, more preferably a silsesquioxane polymer. Such SiO containing polymers preferably contain monomers of the structure:

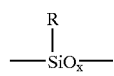
(I)

where R is a group which contains (i) a polar moiety which promotes alkaline solubility of the resist in aqueous alkaline solutions, (ii) a modulating moiety which increases the glass transition temperature and/or modulates the dissolution rate of the polymeric component, (iii) acid labile moiety which inhibits solubility of the resist in aqueous alkaline solutions, and x is about 1 to 1.5. Where the SiO-containing polymer is a silsesquioxane polymer x is about 1.5.

The SiO-containing polymer preferably contains a combination of such monomers (I) having different R groups selected from (i)–(iii). Thus, the SiO-containing polymer preferably contains one or more monomers selected from the group consisting of:

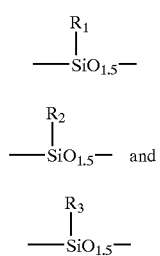

where $R_1$ contains a polar moiety which promotes alkaline solubility of the resist in aqueous alkaline solutions, $R_2$ contains a modulating group which increases the glass transition temperature and/or modulates the dissolution rate of the polymeric component, and $R_3$ contains an acid labile moiety which inhibits solubility of the resist in aqueous alkaline solutions. The SiO-containing polymer preferably contains a combination of monomers (i) with monomers (ii) and/or (iii). It is generally preferred that the SiO-containing polymer contain at least a combination of monomers (i) and (ii) or a combination of monomers (i) and (iii).

The polar moiety contained in $R_1$ is preferably a hydroxyl or carboxylic acid moiety, more a hydroxyl moiety. $R_1$ is preferably a hydroxybenzyl or hydroxymethylbenzyl group.

The modulating group contained in $R_2$ preferably comprises a linear or cyclic carbon structure, more preferably a $C_6$–$C_{10}$ structure, most preferably a $C_6$–$C_{10}$ cyclic structure. Preferred modulating groups are selected from the group consisting of p-toluenesulfonate, camphorsulfonate, and adamantane carboxylate. Alternatively, the modulating group may be an alkoxy moiety. $R_2$ preferably contains an additional aromatic ring associated with a hydroxybenzyl or hydroxymethylbenzyl group on the silsesquioxane to which the modulating group is attached. Examples of modulating group precursors are chlorides such as p-toluenesulfonyl chloride, camphorsulfonyl chloride, and adamantcarboxyl chloride which are shown as structures (II) (a–c) below:

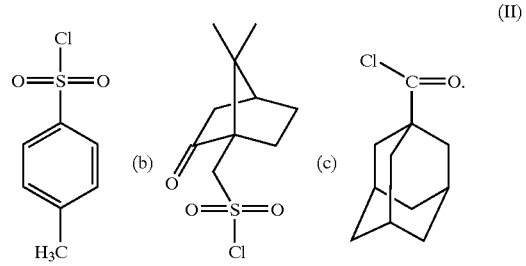

Where the SiO containing monomer is a hydroxybenzyl silsesquioxane such as shown below in structure (III), the modulating group precursor would preferably be reacted to produce a sulfonate or ester such as shown in structures (IV).

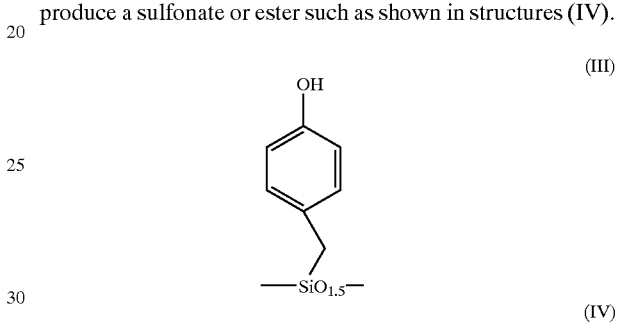

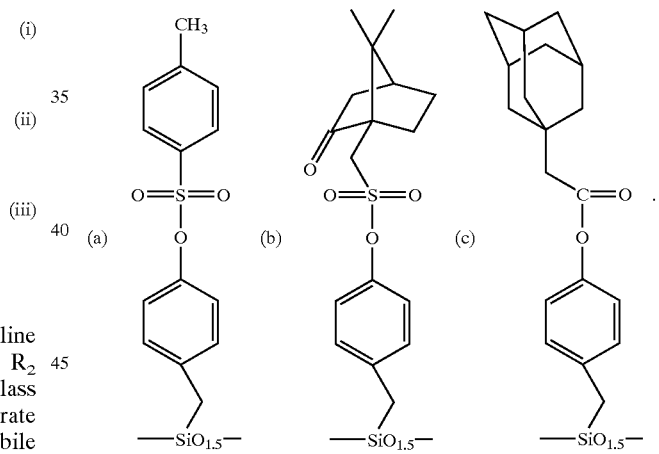

Group $R_3$ contains an acid labile moiety which inhibits solubility of the resist in aqueous alkaline solutions. $R_3$ may contain any suitable acid labile moiety which can be formed as a part of a pendant group from the siloxane or silsesquioxane structure. Preferably, the acid labile moiety contained in $R_3$ is a ketal, more preferably a cyclic aliphatic ketal such as methoxycyclopropanyl, ethoxycyclopropanyl, butoxycyclohexanyl, methoxycyclobutanyl, ethoxycyclobutanyl, methoxycyclopentanyl, ethoxycyclopentanyl, methoxycyclohexanyl, ethoxycyclohexanyl, propoxycyclohexanyl, methoxycycloheptanyl, methoxycyclooctanyl or methoxyadamantyl. These types of acid labile protecting moieties are described in U.S. Pat. No. 6,043,003, the disclosure of which is incorporated herein by reference. Methoxycyclohexanyl (MOCH) is a preferred acid labile protecting moiety. Preferably, the $R_3$ group is formed by reacting an OH group of a hydroxybenzyl or hydroxymethylbenzyl silsesquioxane with the cyclic ketal in a manner similar to the reaction with the OH group of hydroxystyrene described in U.S. Pat. No. 6,043,003. For MOCH and hydroxybenzyl silsesquioxane, the structure would be as in structure (V) below. Alternatively, other acid labile protecting moieties may be used such as t-butyl esters, t-butyl ethers, acetals, silyl ether, etc.

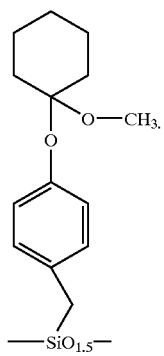

(V)

The SiO-containing polymer preferably contains about 0–90 mole % of monomers having $R_1$ groups, more preferably about 50–90 mole %; about 0–40 mole % of monomers having $R_2$ groups, more preferably about 3–40 mole %, most preferably about 5–30 mole %; about 0–99 mole % of monomers having of monomers having $R_3$ groups, more preferably about 7–99 mole %, most preferably about 10–50 mole %.

If desired, some or all-of the SiO-containing polymer of the polymeric component may have SiO moieties present in pendant groups from the polymer backbone. The backbone of such polymers may contain SiO moieties also or may be free of SiO moieties. For example, so-called polyhedral oligomeric silsesquioxane (POSS) can be grafted onto backbone polymers such as polystyrene or more preferably polyhydroxystyrene. Examples of such oligomers are described in U.S. Pat. No. 5,484,867 and in an article titled "Hybrid Organic-lnorganic Thermoplastics: Styryl-Based Polyhedral Oligomeric Silsesquioxane Polymers" by Haddad et al. published in Macromolecules, vol. 29, p. 7302–7304 (1996)., the disclosures of which are incorporated herein by reference. Examples of such polymers are acrylates such as:

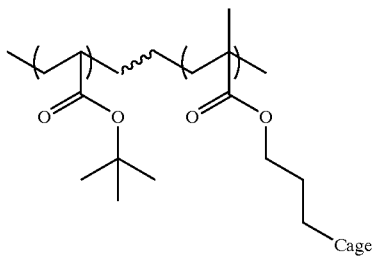

where cage refers to the POSS group, or styrenic copolymers such as:

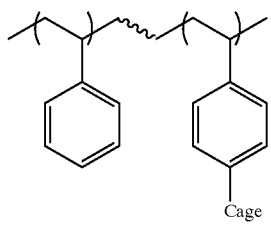

The polymeric component may (if desired) contain other polymers in combination with the first SiO-containing polymer. For example, if the first SiO-containing polymer does not contain pendant groups having an acid labile moiety which inhibits solubility of the resist in aqueous alkaline solutions (or does not contain a sufficient amount of such groups), the acid labile inhibiting function may be provided by a second polymer which is present as part of the polymeric component. Such second polymer would preferably contain a combination of groups containing an acid labile protecting moiety and groups containing a moiety which promotes alkaline solubility of the resist in aqueous alkaline solutions. The proportions of groups containing an acid labile protecting moiety and groups containing a moiety that promotes solubility in the second polymer would be such that combined with the first polymer and any other polymers which may make up the total polymeric component, the overall resist system exhibits the desired response to acid generated in the radiation exposure and to subsequent contact with the alkaline developer.

Examples of second polymers might be (i) a polyhydroxybenzylsilsesquioxane where MOCH groups are substituted for some of the hydroxyl groups, or a polyhydroxystyrene where acid labile protecting groups (e.g. ketals, acetals, t-butyloxycarbonyloxy, etc.) are substituted for some of the hydroxyl groups.

In general, the invention is not limited to any specific number of polymers which may make up the polymeric component. The overall polymeric component should contain at least about 5 wt. % SiO, more preferably about 9–22 wt. %. The polymers which contain SiO in the polymeric backbone preferably have a weight average molecular weight of about 1000–10000. The polymers which do not contain SiO in the backbone preferably have a weight average molecular weight of about 5,000–100,000, more preferably about 10,000–50,000.

The polymers making up the resist of the invention may be made by techniques known in the art. It should be understood that the invention is not limited to any specific method of synthesizing the polymers. For example, it may be possible to polymerize monomers and then create the desired functionality or the functionality may be present on the monomers prior to polymerization.

The resist compositions of the invention contain a radiation-sensitive acid generator. The invention is not limited to the use of any specific acid generator or combination of acid generators, that is the benefits of the invention may be achieved using various acid generators known in the art. Examples of suitable radiation-sensitive acid generators include (but preferably with alkyl substituted for one or more of any indicated aryl moieties) onium salts such as triaryl sulfonium hexafluoroantimonate, diaryliodonium hexafluoroantimonate, hexafluoroarsenates, triflates, perfluoroalkane sulfonates (e.g., perfluoromethane sulfonate, perfluorobutane, perfluorohexane sulfonate, perfluorooctane sulfonate etc.), substituted aryl sulfonates such as pyrogallols (e.g. trimesylate of pyrogallol or tris(sulfonate) of pyrogallol), sulfonate esters of hydroxyimides, N-sulfonyloxynaphthalimides (N-camphorsulfonyloxynaphthalimide, N-pentafluorobenzenesulfonyloxynaphthalimide), α-α'bis-sulfonyl diazomethanes, naphthoquinone-4-diazides, alkyl disulfones and others.

The resist compositions of the invention will typically contain a solvent prior to their application to the desired substrate. The solvent may be any solvent conventionally used with acid-catalyzed resists which otherwise does not have any excessively adverse impact on the performance of the resist composition. Preferred solvents are propylene glycol monomethyl ether acetate, cyclohexanone, and ethyl cellosolve acetate.

The compositions of the invention may further contain minor amounts of auxiliary components such as dyes/sensitizers, base additives, etc. as are known in the art. Preferred base additives are bases which scavenge trace acids while not having an excessive impact on the performance of the resist. Preferred base additives are (aliphatic or alicyclic) tertiary alkyl amines or tetraalkyl ammonium hydroxides such as t-butyl ammonium hydroxide (TBAH).

The resist compositions of the invention preferably contain about 0.5–20 wt. % (more preferably about 3–15 wt. %) acid generator based on the total weight of the polymeric component in the composition. Where a solvent is present, the overall composition preferably contains about 50–90 wt. % solvent. The composition preferably contains about 1 wt. % or less of said base additive based on the total weight of polymeric component.

The resist compositions of the invention can be prepared by combining the polymeric component, acid generator and any other desired ingredients using conventional methods. The resist composition to be used in lithographic processes will generally have a significant amount of solvent.

The resist compositions of the invention are especially useful for lithographic processes used in the manufacture of integrated circuits on semiconductor substrates. The compositions are especially useful for lithographic processes using electron beam radiation. Where use of other radiation (e.g. mid-UV, 248 nm deep UV, 193 nm UV, or x-ray) is desired, the compositions of the invention can be adjusted (if necessary) by the addition of an appropriate dye or sensitizer to the composition.

The invention encompasses a method of creating a patterned material structure on a substrate, the method comprising:

(a) providing a substrate having material layer thereon to be patterned, (b) providing a layer of positive resist over the material layer, the radiation-sensitive resist comprising a polymeric component, at least a portion of the polymeric component containing SiO moieties, at least a portion of the polymeric component containing pendant acid labile moieties which inhibit solubility of the resist in aqueous alkaline solutions, and at least a portion of the polymeric component containing pendant polar moieties which promote alkaline solubility of the resist in aqueous alkaline solutions, (c) pattern wise exposing portions of the resist to imaging radiation, (d) removing the exposed portions of the resist to form spaces defined by remaining unexposed portions of the resist layer, (e) removing portions of the material layer at the spaces by contacting the material layer with an etchant compound comprising a halogen atom selected from the group consisting of Cl, Br, and I, and (f) removing any remaining portions of the resist layer.

The material layer of the substrate may be a metal conductor layer, a ceramic insulator layer, a semiconductor layer or other material depending on the stage of the manufacture process and the desired material set for the end product. The invention is most useful in the context where the material layer to be patterned is a metal, more preferably a chromium-containing metal. The material to be patterned may be applied using any suitable technique. The substrate is preferably a semiconductor wafer or a glass (e.g., fused quartz) plate.

If desired, an antireflective coating (ARC) may be applied over the material layer before application of the resist layer. The ARC layer may be any conventional ARC which is compatible with acid catalyzed resists, the underlying material layer, subsequent processing.

Typically, the solvent-containing resist composition may then be applied to the desired substrate using spin coating or other technique. The substrate with the resist coating is then preferably heated (pre-exposure baked) to remove the solvent and improve the coherence of the resist layer. The thickness of the applied layer is preferably as thin as possible with the provisos that the thickness is preferably substantially uniform and that the resist layer be sufficient to withstand subsequent processing (typically reactive ion etching) to transfer the lithographic pattern to the underlying substrate material layer. The pre-exposure bake step is preferably conducted for about 10 seconds to 15 minutes, more preferably about 15 seconds to one minute. The pre-exposure bake temperature may vary depending on the glass transition temperature of the resist.

After solvent removal, the resist layer is then patternwise-exposed to the desired radiation (e.g., electron beam or deep UV radiation). Where scanning particle beams (such as scanning electron beam) are used, pattern wise exposure may be achieved by scanning the beam across the substrate to selectively apply the beam energy in the desired pattern. Where wavelike radiation forms such as 248 nm ultraviolet radiation, the pattern wise exposure is typically conducted through a mask which is placed over the resist layer. For 248 nm UV radiation, the total exposure energy is preferably about 100 millijoules/cm$^2$ or less, more preferably about 50 millijoules/cm$^2$ or less (e.g. 15–30 millijoules/cm$^2$).

After the desired pattern wise exposure, the resist layer is typically baked to further complete the acid-catalyzed reaction and to enhance the contrast of the exposed pattern. The post-exposure bake is preferably conducted at about 60–175° C., more preferably about 90°–160° C. The post-exposure bake is preferably conducted for about 30 seconds to 5 minutes.

After post-exposure bake, the resist structure with the desired pattern is obtained (developed) by contacting the resist layer with an alkaline solution which selectively dissolves the areas of the resist which were exposed to radiation. Preferred alkaline solutions (developers) are aqueous solutions of tetramethyl ammonium hydroxide. Preferably, the resist compositions of the invention can be developed with conventional 0.26N aqueous alkaline solutions. The resist compositions of the invention can also be developed using 0.14N or 0.21N or other aqueous alkaline solutions. The resulting resist structure on the substrate is then typically dried to remove any remaining developer solvent.

The pattern from the resist structure may then be transferred to the material (e.g., ceramic, metal or semiconductor)

of the underlying substrate. Typically, the transfer is achieved by reactive ion etching or some other etching technique. The most preferred application for the resist materials of the invention is in the patterning of metal layers, especially chromium-containing metal compositions as are commonly used for mask-making. In such applications, a halogen compound-containing pattern transfer etchant where the halogen is Cl, Br or I is typically used (e.g., $Cl_2$, $Br_2$, $I_2$, and $BCl_3$). The halogen compound-containing etchant may contain a combination of halogen compounds and/or may contain additional compounds such as a strong oxidant (e.g., $O_2$). A combination of $Cl_2$ and $O_2$ is a generally preferred etchant. The etching process described in U.S. Pat. No. 5,948,570 except that no post-development oxidation step is required using the resist of the present invention. The disclosure of U.S. Pat. No. 5,948,570 is incorporated herein by reference. Other suitable etching techniques also may be used.

The compositions of the invention and resulting resist structures can be used to create other patterned material layer structures such as metal wiring lines, holes for contacts or vias, insulation sections (e.g., damascene trenches or shallow trench isolation), trenches for capacitor structures, etc. as might be used in the design of integrated circuit devices.

The processes for making these (ceramic, metal or semiconductor) features generally involve providing a material layer or section of the substrate to be patterned, applying a layer of resist over the material layer or section, patternwise exposing the resist to radiation, developing the pattern by contacting the exposed resist with a solvent, etching the layer(s) underlying the resist layer at spaces in the pattern whereby a patterned material layer or substrate section is formed, and removing any remaining resist from the substrate. In some instances, a hard mask may be used below the resist layer to facilitate transfer of the pattern to a further underlying material layer or section. Examples of such processes are disclosed in U.S. Pat. Nos. 4,855,017; 5,362,663; 5,429,710; 5,562,801; 5,618,751; 5,744,376; 5,801,094; 5,821,469, and 5,948,570, the disclosures of which patents are incorporated herein by reference. Other examples of pattern transfer processes are described in Chapters 12 and 13 of "Semiconductor Lithography, Principles, Practices, and Materials" by Wayne Moreau, Plenum Press, (1988), the disclosure of which is incorporated herein by reference. It should be understood that the invention is not limited to any specific lithography technique or device structure.

EXAMPLE 1
Synthesis of MOCH-protected Polyvinylphenol (Monodisperse Polymer)

150 g of propylene glycol methyl ether acetate (PGMEA) was added to 50 g of polyvinylphenol (VP5000 from Tomen). The mixture was stirred until a clear solution was obtained. The solution was then combined with approximately 35 mg of oxalic acid. After the acid was dissolved, 18.5 g of 1-methoxycyclohexene was added to the solution, and the reaction was carried out at room temperature with stirring overnight. The reaction was then quenched with 6 g of basic active aluminum oxide. The protection level of 25% on phenol group was determined by $C^{13}$ NMR.

EXAMPLE 2
Synthesis of Partially MOCH-protected Maruzen Polyhydroxystyrene (PHMC) (10% Hydrogenated)

750 g of propylene glycol methyl ether acetate (PGMEA) was added to 250 g of PHMC. The mixture was stirred until a clear solution was obtained. The solution was then combined with approximately 150 mg of oxalic acid. After the acid was dissolved, 90 g of 1-methoxycyclohexene was added to the solution, and the reaction was carried out at room temperature with stirring overnight. The reaction was then quenched with 20 g of basic active aluminum oxide. The protection level of 18.5% on phenol group was determined by $C^{13}$ NMR.

EXAMPLE 3
Synthesis of MOCH-protected Poly(4-hydroxybenzylsilsesquioxane) (PHBS)

The MOCH-protected PHBS was synthesized using the same procedure as Example 1 with PHBS in place of the polyvinylphenol except that the amount of 1-methoxycyclohexene used was sufficient to achieve a protection level of 47%. The PHBS-MOCH solution appeared to be unstable overnight. The solution was quenched with excess of aluminum oxide (10 g instead of 6 g), and then passed through 2.5 inches of packed basic active aluminum oxide column to remove any residual acid and other insoluble components in the solution.

EXAMPLE 4
Synthesis of MOCH-protected Poly(4-hydroxymethylbenzylsilsesquioxane) (PHMBS)

The MOCH-protected PHBS was synthesized using the same procedure as Example 1 with PHBS in place of the polyvinylphenol except that the amount of 1-methoxycyclohexene increased to achieve a protection level of 46%. The solution was quenched with basic active aluminum oxide as described in Example 1.

EXAMPLE 5
Synthesis of p-toluenesulfonate(TS)-protected PHBS and Camphorsulfonate(CS)-protected PHBS 100 g of γ-butyrolactone was added to 23.88 g of PHBS with 11.44 g of p-toluenesulfonyl chloride, and the mixture was stirred until a clear solution was obtained. 6.19 g of 4-methylmorpholine was added dropwise to the solution. After the addition of 4-methylmorpholine was finished, the reaction was allowed to continue at room temperature with stirring overnight. Then, solid polymer product was precipitated by dripping the polymer solution into deionized water containing 0.1M HCl. After filtration and washing with water, the solid was suction-dried. TGA indicated that the polymer after this first precipitation contained around 3–5% residual p-tolunesulfonyl compounds. Therefore, the polymer was redissolved in 100 ml of acetone and reprecipitated with water. The polymer was then dried under vacuum at around 60° C. overnight. TGA data showed no volatile products before 330° C., and $C^{13}$ NMR indicated a 32% protection of p-toluenesulfonate on the phenol group was obtained on the final dried polymer. Using the same procedure with reprecipitation as necessary, we obtained the polymers shown in Table 1 where $T_g$ is the glass transition temperature, $T_d$ is the decomposition temperature and $M_w$ is the weight average molecular weight.

TABLE 1

| Polymer | $T_g$ | $T_d$ | $M_w$ |
|---|---|---|---|
| PHBS | 96° C. | ~450° C. | 5858 |
| PHBS-TS (8%) | 96° C. | — | 9627 |
| PHBS-TS (19%) | 89° C. | 330° C. | 7477 |
| PHBS-TS (25%) | 99° C. | 337° C. | 7076 |

TABLE 1-continued

| Polymer | $T_g$ | $T_d$ | $M_w$ |
|---|---|---|---|
| PHBS-TS (32%) | 89° C. | 337° C. | 6889 |
| PHBS-CS (12%) | 86° C. | 326° C. | 3706 |
| PHBS-CS (19%) | 116° C. | 325° C. | 6752 |

EXAMPLE 6

Synthesis of 1-adamantanecarboxylate O-protected PHBS 20 g PHBS were dissolved in 50 ml tetrahydrofurane (THF), and 5 g of 1-adamantanecarboxylic acid chloride were added with stirring. 2.5 g of triethylamine were then added, and stirring was continued for three days at room temperature. The precipitated salts were removed by filtration. The filtrate was concentrated on a rotary evaporator and poured into water. The solid was decanted and washed several times with water. The solid product was then redissolved in THF, and the process of precipitation with water was repeated. The final product was dried in air for 12 hours and in vacuum for 24 hours. The product contained 6% phenol O-protected with 1-adamantanecarboxylate.

EXAMPLE 7

Synthesis of MOCH-protected PHBS-TS and MOCH-protected PHBS-CS

PHBS-TS-MOCH and PHBS-CS-MOCH (MOCH-protected PHBS-TS and PHBS-CS) were synthesized using the same procedure as Example 1 using the polymers synthesized in Example 5. The resulting polymers are listed in Table 2 below:

TABLE 2

| Polymer | Protection with TS or CS | Protection of MOCH |
|---|---|---|
| PHBS-TS19-MOCH19 | 19% TS | 19% MOCH |
| PHBS-TS8-MOCH22 | 8% TS | 22% MOCH |
| PHBS-CS19-MOCH19 | 19% CS | 19% MOCH |

TABLE 3

Summary of Polymers Prepared in by Synthesis Examples 1–7

| Polymer | Description | Synthesis Example |
|---|---|---|
| P1 | MOCH-protected PHS-25% protection | 1 |
| P2 | MOCH-protected PHMC-18.5% protection | 2 |
| P3 | MOCH-protected PHBS-47% protection | 3 |
| P4 | MOCH-protected PHMBS-46% protection | 4 |
| P5 | TS-protected PHBS-8% protection | 5 |
| P6 | TS-protected PHBS-19% protection | 5 |
| P7 | TS-protected PHBS-25% protection | 5 |
| P8 | TS-protected PHBS-32% protection | 5 |
| P9 | CS-protected PHBS-12% protection | 5 |
| P10 | CS-protected PHBS-19% protection | 5 |
| P11 | AC-protected PHBS-6% protection | 6 |
| P12 | MOCH-TS-PHBS-19% TS-19% MOCH | 7 |
| P13 | MOCH-TS-PHBS-8% TS-22% MOCH | 7 |
| P14 | MOCH-CS-PHBS-19% CS-19% MOCH | 7 |

Standard Resist Formulation

Resist formulations were prepared in the examples below by mixing the desired polymer(s) with 0.14 wt. % tetrabutyl ammonium hydroxide (TBAH) and 0.7 wt. % triphenylsulfonium triflate (TPS) and 200–400 ppm of FC-430 surfactant (sold by 3M Corporation) in PGMEA solvent. The total solids content in the resulting formulation was about 14 wt. %.

EXAMPLE 8

A resist formulation according to the invention containing a blend (B1) of PHBS-MOCH (P3) and PHMC-MOCH (P2) at a 80/20 wt. ratio was prepared using the standard resist formulation above. The resist formulation was spin-coated onto hexamethyldisilazane (HMDS)-primed wafer. The film was baked on a hot plate at 110° C. for 1 minute. As a comparison, a ZEP-7000A resist (commercial E-beam resist manufactured by Nippon Zeon) spin-coated onto hexamethyidisilazane(HMDS)-primed wafer and baked at 180° C. for 3 minutes and 100° C. for one minute.

Etch rate and thickness loss of these formulations (in Table 5 below) were compared using a standard $Cl_2/O_2$ chromium etch process with the parameters described in Table 4 below. No film oxidation treatment was performed prior to etching.

TABLE 4

| | |
|---|---|
| $Cl_2$ flow | 24 sccm |
| $O_2$ flow | 6 sccm |
| Pressure | 12 mT |
| ICP power | 500 W |
| rf substrate power | 11 W |
| dc bias voltage | −110 V |

TABLE 5

| Resist | Thickness loss after 50 sec. (nm) | Thickness loss after 90 sec. (nm) | Etch rate (nm/s) for 50 sec. etch | Etch rate (nm/s) for 90 sec. etch |
|---|---|---|---|---|
| ZEP 7000 A | 98 | 135 | 2 | 1.5 |
| B1 blend | 65 | 44 | 1.3 | 0.48 |

EXAMPLE 9

Resist formulations (using the standard formulation above) were prepared based polymers P2, P8, and on blends (B2, B3, B4) of polymers P2 and P8. The P2-only formulation is similar to the formulations described in U.S. Pat. No. 6,037,097 (Example 9). The resist formulations were spin-coated onto hexamethyldisilazane (HMDS)-primed wafer, followed by baking on a hot plate at 110° C. for 1 minute. Additional coated wafers were prepared using ZEP 7000A resist in the manner described in Example 8 and UV-II resist (deep UV resist sold by Shipley Company). The thickness loss (Table 6 below) after a 120 second etch was determined using the etch conditions of Example 8. No oxidation treatment was performed prior to etching.

TABLE 6

| Resist | Wt. % P8 | Wt. % P2 | Thickness loss (nm) |
|---|---|---|---|
| P2 (prior art) | 0 | 100 | 215 |
| B2 blend | 25 | 75 | 141 |
| B3 blend | 50 | 50 | 67 |
| B4 blend | 75 | 25 | 47 |
| P8 | 100 | 0 | 25 |
| ZEP | — | — | 248 |
| UV-II | — | — | 245 |

A resist blend (B5) according to the invention was prepared by combining 25 parts by weight of polymer P7 (PHBS—25% TS-protected) with 100 parts by weight (solids basis) of UV-II resist. Resist B5 was tested in a similar manner to the resists based on blends B2–B4 and showed a thickness loss on 120 etch of 151 nm.

EXAMPLE 10

Using the standard formulation above, resists were formulated with blends, B6 and B7, of polymer P2 (PHMC-MOCH) with polymers P3 (PHBS-MOCH) and P4 (PHMBS-MOCH) respectively. An additional resist formulation was prepared using polymer P3 alone. Coated wafers of each formulation were prepared using the coat/bake procedure of Example 9 above. Each wafer was then exposed on a 75 kV E-beam exposure tool (EL4+). After exposure, the resists were baked at 110° C. for 1 minute developed with 0.263 N TMAH for 60 seconds, and then developed with 0.263 N TMAH for 60 seconds. The resist images were examined with SEM. The resist formulations in Table 7 resolved the finest pattern of the exposure program.

TABLE 7

| Resist | Blend Ratio | Image resolved | dose |
|---|---|---|---|
| P3 | — | 75 nm | 15 $\mu C$ |
| B6 | 80 P3/20 P2 | 75 nm | 18 $\mu C$ |
| B7 | 50 P4/50 P2 | 75 nm | 23 $\mu C$ |

EXAMPLE 11

Using the standard formulation above, resists were formulated with blends, B8 through B15, of polymer P1 (PHS-MOCH) with polymers P6 (PHBS—19% TS-protected) or P7 (PHBS—25% TS-protected) with a substitution of triphenylsulfonium perfluorooctanesulfonate (PFOS) for triphenylsulfonium triflate as indicated in Table 8. Coated wafers of each formulation were prepared using the coat/bake procedure of Example 9 above. Each wafer was then exposed on a 25 kV vector E-beam exposure tool. After exposure, the resists were baked at 110° C. for 1 minute developed with 0.263 N TMAH for 60 seconds, and then developed with 0.263 N TMAH for 60 seconds. The resist images were examined with SEM. The resist formulations resolved the finest pattern (200 nm) of the exposure program.

TABLE 8

| Resist | Composition | Dose | Image size resolved |
|---|---|---|---|
| B8 | 85% P1 15% P7 (PFOS) | 7.5 $\mu C$ | 200 nm |
| B9 | 80% P1 20% P7 (PFOS) | 7.5 $\mu C$ | 200 nm |
| B10 | 75% P1 25% P7 | 6 $\mu C$ | 200 nm |
| B11 | 50% P1 50% P7 | 7 $\mu C$ | 200 nm |
| B12 | 85% P1 15% P6 | 6 $\mu C$ | 200 nm |
| B13 | 80% P1 20% P6 | 6 $\mu C$ | 200 nm |
| B14 | 75% P1 25% P6 | 6 $\mu C$ | 200 nm |
| B15 | 75% P1 25% P6 (PFOS −2x amt.) | 5.5 $\mu C$ | 200 nm |

EXAMPLE 12

Using the standard formulation above, resists were formulated with polymers P13 (MOCH-TS-PHBS—8% TS—22% MOCH) and P14 (MOCH-CS-PHBS—19% CS—19% MOCH). Also a formulation was prepared using a blend, B16, of 70 wt. % polymer P14 and 30 wt. % polymer P1 (PHS-MOCH). Coated wafers of each formulation were prepared using the coat/bake procedure of Example 9 above. Each wafer was then exposed on a 25 kV vector E-beam exposure tool. After exposure, the P14 and B16 based resists were baked at 110° C. for 1 minute developed with 0.263 N TMAH for 60 seconds, and then developed with 0.263 N TMAH for 60 seconds. The P13 resist was held for 30 minutes after exposure (without post-exposure baking) and then developed with 0.263 N TMAH for 60 seconds. The resist images were examined with SEM with the results indicated in Table 9.

TABLE 9

| Resist | Dose | Image size resolved and quality |
|---|---|---|
| P13 | 9 $\mu C$ | 250 nm L/S with skin |
| P14 | 8.5 $\mu C$ | 250 nm L/S with foot |
| B16 | 9 $\mu C$ | 250 nm L/S with very little foot |

In the same manner, UV-II resist was compared to a resist based on blend B5 of Example 9 above. The 250 nm line/space images using the B5 blend resist showed better sidewall profile.

What is claimed is:

1. A method of making a patterned metal layer, said metal being selected from the group consisting of Cr, Cu, Al, and alloys thereof on a substrate, said method comprising:
   (a) providing a substrate having metal layer thereon,
   (b) providing a layer of positive resist over said metal layer, said radiation-sensitive resist comprising a polymeric component, at least a portion of said polymeric component containing SiO moieties, at least a portion of said polymeric component containing pendant acid labile moieties which inhibit solubility of the resist in aqueous alkaline solutions, and at least a portion of said polymeric component containing pendant polar moieties which promote alkaline solubility of said resist in aqueous alkaline solutions,
   (c) patternwise exposing portions of said resist to imaging radiation,
   (d) removing said exposed portions of said resist to form spaces defined by remaining unexposed portions of said resist layer,
   (e) removing portions of said metal layer at said spaces by contacting said material layer with an etchant compound comprising a halogen atom selected from the group consisting of CI, Br, and I, and
   (f) removing any remaining portions of said resist layer.

2. The method of claim 1 wherein said resist is an acid-catalyzed resist comprising:
   (i) said polymeric component, and (ii) a radiation-sensitive acid generator.

3. The method of claim 2 wherein said SiO moieties are located in a polymer backbone of at least a portion of said polymeric component.

4. The method of claim 3 wherein said portion of polymeric component containing SiO moieties in its backbone is a silsesquioxane polymer.

5. The method of claim 4 wherein said silsesquioxane polymer comprises monomeric units:

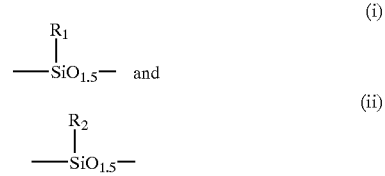

where $R_1$ comprises a polar moiety which promotes alkaline solubility of said resist in aqueous alkaline solutions and $R_2$ comprises a modulating group which increases the glass transition temperature of said polymeric component.

6. The method of claim 5 wherein said silsesquioxane polymer comprises monomeric units:

(iii)

where $R_3$ comprises an acid labile moiety which inhibits solubility of the resist in aqueous alkaline solutions.

7. The method of claim 4 wherein said polymeric component comprises a blend of said SiO-containing polymer and a second polymer, said second polymer comprising pendant acid labile moieties which inhibit solubility of the resist in aqueous alkaline solutions and pendant polar moieties which promote alkaline solubility of said resist in aqueous alkaline solutions.

8. The method of claim 7 wherein said second polymer contains SiO moieties.

9. The method of claim 2 wherein said SiO moieties are located in groups pendant from a polymer backbone of at least a portion of said polymeric component.

10. The method of claim 3 wherein said polymeric component comprises a blend of said SiO-containing polymer and a second polymer, said second polymer comprising pendant acid labile moieties which inhibit solubility of the resist in aqueous alkaline solutions and pendant polar moieties which promote alkaline solubility of said resist in aqueous alkaline solutions.

11. The method of claim 10 wherein said acid labile groups of said second polymer comprise ketal moieties.

12. The method of claim 11 wherein said pendant polar moieties of said second polymer comprise hydroxyl moieties.

13. The method of claim 1 wherein said polar moieties are comprise hydroxyl groups.

14. The method of claim 1 wherein said acid labile groups comprise ketal moieties.

15. The method of claim 1 wherein said etchant compound is selected from the group consisting of $Cl_2$, $Br_2$, $I_2$, and $BCl_3$.

16. The method of claim 15 wherein said etchant compound is $Cl_2$.

17. The method of claim 15 wherein $O_2$ is also present with said etchant compound.

18. The method of claim 1 wherein said material layer comprises chromium.

19. The method of claim 18 wherein said substrate is a glass plate.

20. The method of claim 1 further comprising: providing an antireflective coating layer over said material layer, prior to step (b), such that portions of said antireflective coating layer are exposed in said spaces formed in step (d), and removing such exposed portions of antireflective coating layer prior to step (e).

21. The method of claim 20 wherein said antireflective coating is a polysilane.

22. The method of claim 1 wherein said radiation is selected from the group consisting of (a) ultraviolet radiation having a wavelength less than 250 nm, and (b) electron beam radiation.

23. A positive resist composition, said composition comprising:

(a) a polymeric component, said polymeric component comprising a blend of a first polymer having SiO moieties located in a polymer backbone of first polymer and a second polymer, said second polymer comprising pendant acid labile ketal moieties which inhibit solubility of the resist in aqueous alkaline solutions and pendant polar moieties which promote alkaline solubility of said resist in aqueous alkaline solutions and (b) a radiation-sensitive acid generator.

24. The composition of claim 23 wherein said polar moieties are comprise hydroxyl groups.

25. The composition of claim 23 herein said first polymer is a silsesquioxane polymer.

26. The composition of claim 25 wherein said silsesquioxane polymer comprises monomeric units:

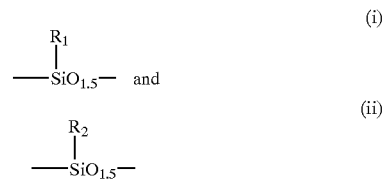

where $R_1$ comprises a polar moiety which promotes alkaline solubility of said resist in aqueous alkaline solutions and $R_2$ comprises a modulating group which increases the glass transition temperature of said polymeric component.

27. The composition of claim 26 wherein said silsesquioxane polymer comprises monomeric units:

(iii)

where $R_3$ comprises an acid labile moiety which inhibits solubility of the resist in aqueous alkaline solutions.

28. The composition of claim 23 wherein said second polymer contains SiO moieties.

* * * * *